United States Patent
Fang et al.

(10) Patent No.: US 10,506,693 B2
(45) Date of Patent: Dec. 10, 2019

(54) SUBSTRATE, TOUCH SCREEN AND TOUCH DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Zhixiang Fang, Beijing (CN); Dayu Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 87 days.

(21) Appl. No.: 15/563,588

(22) PCT Filed: Feb. 16, 2017

(86) PCT No.: PCT/CN2017/073785
§ 371 (c)(1),
(2) Date: Sep. 30, 2017

(87) PCT Pub. No.: WO2017/202070
PCT Pub. Date: Nov. 30, 2017

(65) Prior Publication Data
US 2018/0192503 A1    Jul. 5, 2018

(30) Foreign Application Priority Data

May 26, 2016    (CN) .......................... 2016 1 0362346

(51) Int. Cl.
*G06F 3/00*    (2006.01)
*H05F 3/02*    (2006.01)
(Continued)

(52) U.S. Cl.
CPC ............... *H05F 3/02* (2013.01); *G06F 3/041* (2013.01); *G06F 3/0488* (2013.01);
(Continued)

(58) Field of Classification Search
CPC .......... H05F 3/02; G06F 3/041; G06F 3/0488; G06F 3/0412; G06F 2203/04107; H05K 5/0017; H05K 9/0064
See application file for complete search history.

(56) References Cited

U.S. PATENT DOCUMENTS 3,761,842 A * 9/1973 Gandrud .................. H01B 7/08
333/1
5,397,862 A * 3/1995 Bockelman ....... H01L 23/49838
174/250

(Continued)

FOREIGN PATENT DOCUMENTS

| CN | 102929470 A | 2/2013 |
| CN | 103186287 A | 7/2013 |

(Continued)

OTHER PUBLICATIONS

English Translation CN 103543886 (Year: 2014).*
(Continued)

*Primary Examiner* — Steven T Sawyer
(74) *Attorney, Agent, or Firm* — Calfee, Halter & Griswold LLP

(57) ABSTRACT

A substrate, a touch screen and a touch display device to enhance the anti-interference and anti-static ability of the touch screen are disclosed. The substrate comprises a functional area and a peripheral area, wherein a first wiring and a second wiring insulating from each other are arranged in the peripheral area, the first wiring and second wiring are grounded respectively and are connected to a circuit board respectively to form a ground wire conduction loop; and the (Continued)

first wiring and the second wiring have a plurality of cross points. The touch screen comprises said substrate. The substrate provided in the present disclosure can be used in the touch display device.

12 Claims, 2 Drawing Sheets

(51) Int. Cl.
  *G06F 3/041* (2006.01)
  *G06F 3/0488* (2013.01)
  *H05K 5/00* (2006.01)
  *H05K 9/00* (2006.01)
(52) U.S. Cl.
  CPC ......... *H05K 5/0017* (2013.01); *H05K 9/0064* (2013.01); *G06F 3/0412* (2013.01); *G06F 2203/04107* (2013.01)

(56) References Cited

U.S. PATENT DOCUMENTS

| | | | |
|---|---|---|---|
| 2014/0176825 A1* | 6/2014 | Lee | G06F 3/044 349/12 |
| 2014/0226086 A1* | 8/2014 | Chu | G06F 3/044 349/12 |
| 2015/0083569 A1* | 3/2015 | Chang | G06F 3/044 200/600 |
| 2015/0301645 A1 | 10/2015 | Mu et al. | |
| 2016/0313860 A1* | 10/2016 | Ono | G06F 3/0418 |
| 2017/0075386 A1* | 3/2017 | Park | G06F 1/1626 |
| 2017/0083138 A1 | 3/2017 | Xu et al. | |

FOREIGN PATENT DOCUMENTS

| | | |
|---|---|---|
| CN | 103543886 A | 1/2014 |
| CN | 104731435 A | 6/2015 |
| CN | 205028258 U | 2/2016 |
| CN | 106020547 A | 10/2016 |

OTHER PUBLICATIONS

STIC search (Year: 2019).*
Search Report for International Chinese Patent Application No. PCT/CN2017/073785 dated Apr. 27, 2017.
First Office Action for Chinese Patent Application No. 201610362346.5 dated Aug. 30, 2017.

* cited by examiner

SUBSTRATE, TOUCH SCREEN AND TOUCH DISPLAY DEVICE

RELATED APPLICATION

The present application is the U.S. national phase entry of PCT/CN2017/073785, with an international filing date of Feb. 16, 2017, which claims the benefit of Chinese Patent Application No. 201610362346.5, filed on May 26, 2016, the entire disclosures of which are incorporated herein by reference.

TECHNICAL FIELD

The present disclosure relates to the technical field of touch display, in particular to a substrate, a touch screen and a touch display device.

BACKGROUND

A touch screen is a product having an intelligent human-machine interaction interface, which has been widely used in various display devices. An important branch of the touch screen is One Glass Solution (OGS) touch screen, which can not only function as a touch sensor in a display device, but also function as a protection to the display device. Therefore, the OGS touch screen has gained great attention.

Presently, when making the OGS touch screen, an ITO conductive film and a touch sensor are formed on one glass plate; moreover, in order to lead out the static electricity released in the OGS touch screen, a ground wire conduction loop is arranged on the ITO conductive film of the OGS touch screen. However, the ground wire conduction loop consists of two conductive ground wires, and the two ground wires are liable to be influenced by the antenna effect so as to generate thereon currents having different magnitudes but the same direction, thus interference current will be generated on the ground wire conduction loop. Therefore, in order to prevent the ground wires from being influenced by the interference current, the two ground wires will usually be interrupted, thereby effectively avoiding influence to the ground wires caused by the antenna effect, but this also results in a great reduction in the anti-static ability of the OGS touch screen.

SUMMARY

An object of the present disclosure is to provide a substrate, a touch screen and a touch display device for enhancing the anti-interference and anti-static ability of the touch screen.

According to a first aspect of the present disclosure, a substrate is provided, in which a first wiring and a second wiring insulating from each other are arranged in a peripheral area, said first wiring and second wiring are grounded respectively and are connected to a circuit board respectively to form a ground wire conduction loop; and said first wiring and said second wiring have a plurality of cross points.

In certain exemplary embodiments, said first wiring and said second wiring have a plurality of uniformly distributed cross points.

In certain exemplary embodiments, the first wiring and second wiring between two adjacent cross points are separated from each other, and insulating layers for insulating the first wiring from the second wiring are provided at the cross points of the first wiring and the second wiring.

In certain exemplary embodiments, the plurality of cross points on the first wiring are a plurality of first cross points that are arranged along a wiring direction of the first wiring, and two adjacent first cross points have an interval therebetween; and the plurality of cross points on the second wiring are a plurality of second cross points that are one to one corresponding to the plurality of first cross points and are arranged along a wiring direction of the second wiring, and insulating layers are provided between the first cross points and the corresponding second cross points.

In certain exemplary embodiments, a portion of the first wiring between two adjacent cross points and a portion of the second wiring between two adjacent cross points form a cross unit, and a portion of the first wiring in the cross unit includes a first cross wiring section and a first parallel wiring section, and a portion of the second wiring in the cross unit includes a second cross wiring section and a second parallel wiring section.

In certain exemplary embodiments, a wiring direction of the first parallel wiring section is parallel to a wiring direction of the second parallel wiring section in the same cross unit.

In certain exemplary embodiments, a wiring direction of the first parallel wiring section and a wiring direction of the second parallel wiring section in an adjacent cross unit are on the same straight line.

In certain exemplary embodiments, included angles formed by the first wiring and the second wiring at each cross point are obtuse angles, and areas corresponding to said included angles are in the cross unit.

In certain exemplary embodiments, two adjacent cross points have a distance of at least 1 cm therebetween.

In certain exemplary embodiments, said substrate is a touch substrate; the functional area is a touch area, and the peripheral area is a non-touch area.

In certain exemplary embodiments, said substrate is a display substrate; the functional area is a display area, and the peripheral area is a non-display area.

According to a second aspect of the present disclosure, a touch screen is provided, which comprises any one of the above-described substrates.

According to a third aspect of the present disclosure, a touch display device is provided, which comprises the above-mentioned touch screen.

Since the first wiring and the second wiring have a plurality of cross points and are insulated from each other, anti-interference is realized. Meanwhile, it is unnecessary to interrupt the ground wire conduction loop, so the substrate provided by the present disclosure will not influence the anti-static ability of the touch screen.

BRIEF DESCRIPTION OF THE DRAWINGS

The drawings are provided to facilitate further understanding of the present disclosure and form a part of the disclosure. In the drawings.

DETAILED DESCRIPTION

Reference Signs

1—wiring, 10—insulating layer; 11—first wiring; 12—second wiring; 2 touch screen wiring.

In order to further illustrate the substrate, touch screen and touch display device provided in the embodiments of the present disclosure, detailed descriptions are given below with reference to the drawings.

Figure 1:
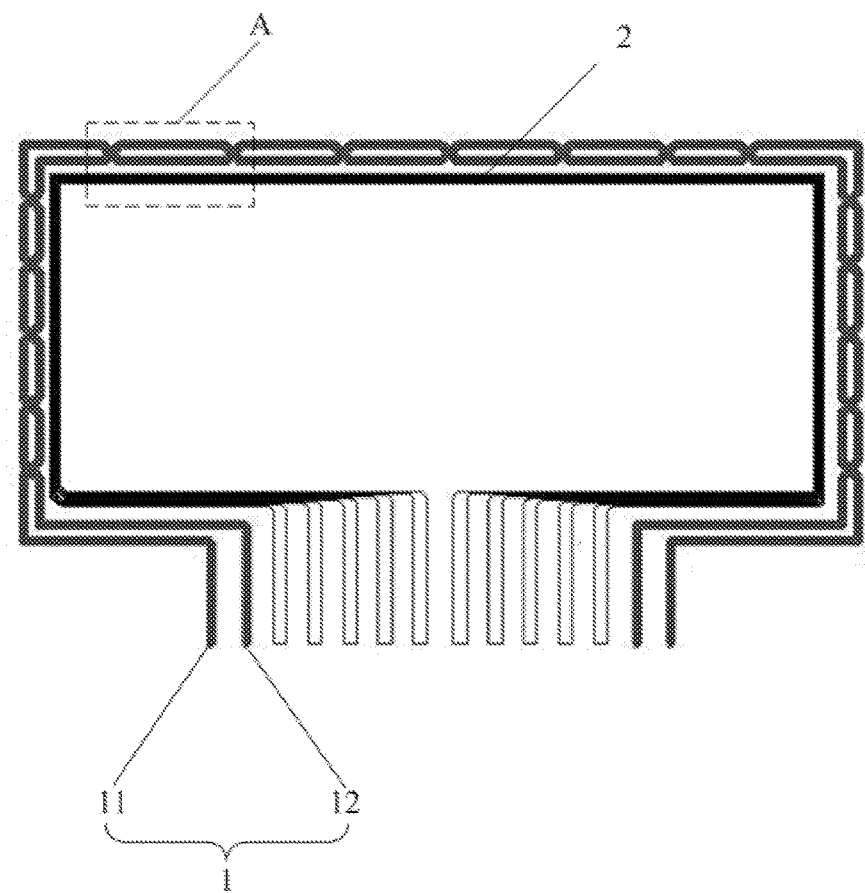
FIG. 1 is a structural diagram of a substrate provided in an embodiment of the present disclosure when being applied to a touch screen.

Referring to FIG. 1, the substrate provided in the embodiment of the present disclosure comprises a functional area and a peripheral area, and the peripheral area is provided with a wiring 1 that includes a first wiring 11 and a second wiring 12 insulated from each other. The first wiring 11 and the second wiring 12 are grounded respectively, and are connected to a circuit board (not shown in FIG. 1) respectively to form a ground wire conduction loop. The first wiring 11 and the second wiring 12 have a plurality of cross points.

In an embodiment, the first wiring 11 and the second wiring 12 lead out the static electricity generated by the touch screen through the ground wire conduction loop. Interference currents will be generated on the first wiring 11 and the second wiring 12 under the interference from an interference source, wherein a total interference current generated on the first wiring 11 is $I_1$, and a total interference current generated on the second wiring 12 is $I_2$.

Figure 2:
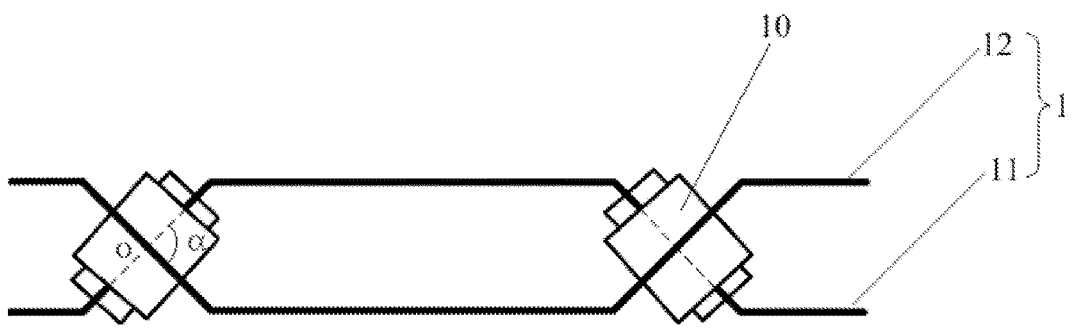
FIG. 2 is an enlarged view of A in FIG. 1.
Figure 3:
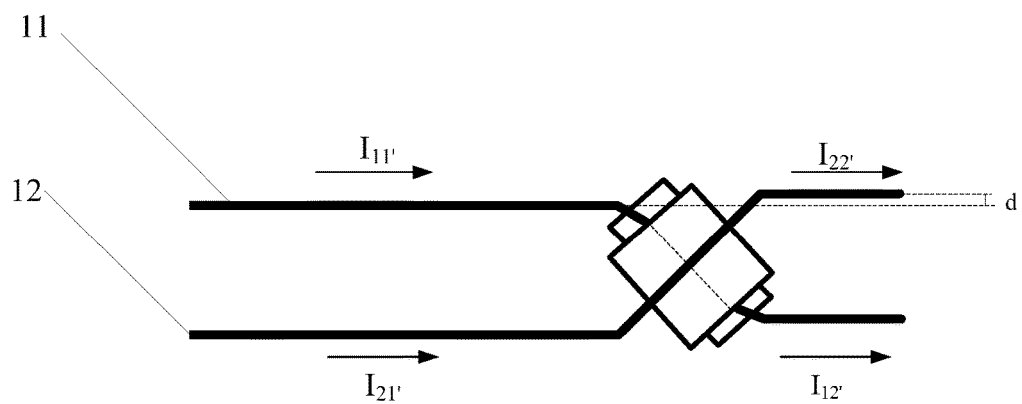
FIG. 3 is a schematic drawing of the interference current acting on the first wiring and the second wiring crossed in a first manner in the substrate provided in the embodiment of the present disclosure.
Figure 4:
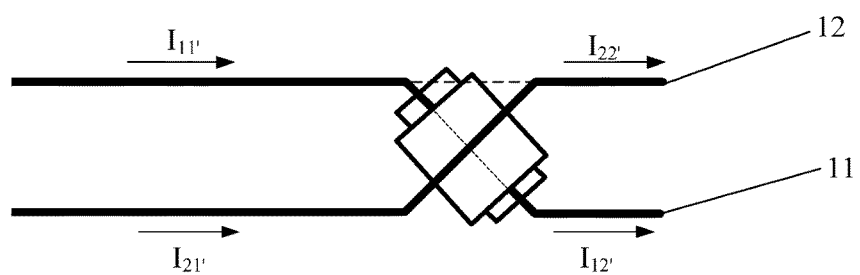
FIG. 4 is a schematic drawing of the interference current acting on the first wiring and the second wiring crossed in a second manner in the substrate provided in the embodiment of the present disclosure.

Referring to FIG. 2, a portion of the first wiring 11 between two adjacent cross points and a portion of the second wiring between two adjacent cross points form a cross unit. FIG. 3 and FIG. 4 show two adjacent cross units, respectively, which are located on the left side and the right side of a cross point. For ease of description, in FIGS. 3 and 4, a portion of the first wiring 11 in the left cross unit is defined as a first left wiring, and an interference current generated on the first left wiring is defined as $I_{11'}$; a portion of the first wiring 11 in the right cross unit in FIGS. 3 and 4 is defined as a first right wiring, and an interference current generated on the first right wiring is defined as $I_{12'}$; a portion of the second wiring 12 in the left cross unit in FIGS. 3 and 4 is defined as a second left wiring, and an interference current generated on the second left wiring is defined as $I_{21'}$; and a portion of the second wiring 12 in the right cross unit in FIGS. 3 and 4 is defined as a second right wiring, and an interference current generated on the second right wiring is defined as $I_{22'}$;

In order to theoretically analyze an interference current magnitude relation among the first left wiring, the first right wiring, the second left wiring and the second right wiring, the first left wiring, the first right wiring, the second left wiring and the second right wiring are idealized as straight lines, namely, the first left wiring and the second left wiring in the left cross unit are both considered as straight lines, and the first right wiring and the second right wiring in the right cross unit are both considered as straight lines. The interference current magnitude relation among the first left wiring, the first right wiring, the second left wiring and the second right wiring, as well as the interference current in the entire ground wire conduction loop will be described in detail below. In addition, the interference source is also idealized as a point, which is called an interference point.

Said interference source is usually high-frequency current or electromagnetic wave, while the position of the interference source is random without limitation.

FIGS. 3 and 4 show that the first left wiring and the first right wiring have different positions. Suppose that the position of the interference source is fixed, then a distance from the interference point to the straight line where the first left wiring is located is different than a distance from the interference point to the straight line where the first right wiring is located, so the interference current $I_{11'}$ generated on the first left wiring and the interference current $I_{12'}$ generated on the first right wiring have the same direction but different magnitudes. Likewise, the interference current $I_{21'}$ generated on the second left wiring and the interference current $I_{22'}$ generated on the second right wiring have the same direction but different magnitudes. The first wiring 11 and the second wiring 12 form the ground wire conduction loop, thus supposing that the first wiring 11 and the second wiring 12 cross to form N cross units, then the interference current in the ground wire conduction loop is $I=I_1-I_2=(I_{11}+I_{12}+\ldots+I_{1N})-(I_{21}+I_{22}+\ldots I_{2N})$; where $I_{11}, I_{12}\ldots I_{1N}$ are interference currents generated on the first wiring 11 in N cross units, and $I_{21}, I_{22}\ldots I_{2N}$ are interference currents generated on the second wiring 12 in N cross units; wherein N is greater than 2.

There are two manners of crossing of the first wiring 11 and the second wiring 12 as shown in FIGS. 3 and 4. Now referring to FIGS. 3 and 4, it will be described how the interference current I on the ground wire conduction loop is reduced in the substrate provided in the above embodiment.

In the first manner of crossing as shown in FIG. 3, a distance d between the straight line where the first left wiring in the left cross unit is located and the straight line where the second right wiring in the right cross unit is located is greater than zero.

If d>0, then supposing that the position of the interference source is fixed, a distance between the straight line where the first left wiring of the first wiring 11 is located and the straight line where the second left wiring of the second wiring 12 is located is large, i.e. an absolute value of $I_{11'}-I_{21'}$ is large. Besides, since the first wiring 11 and the second wiring 12 are crossing, a distance between the straight line where the first left wiring of the first wiring 11 is located and the straight line where the second right wiring of the second wiring 12 is located is small, i.e. an absolute value of $I_{11'}-I_{22'}$ is close to 0. Likewise, although an absolute value of $I_{12'}-I_{22'}$ is large, an absolute value of $I_{21'}-I_{12'}$ is close to 0.

If the first wiring 11 and the second wiring 12 cross to form two cross units, then an absolute value of the interference current $I=I_1-I_2=(I_{11}+I_{12})-(I_{21}+I_{22})=(I_{11}-I_{22})+(I_{12}-I_{21})$ on the ground wire conduction loop is close to but not equal to 0.

According to the above analyses, when the first wiring 11 and the second wiring 12 are crossing, a distance between the straight lines where portions of the first wiring 11 and the second wiring 12 in the same cross unit are located remain unchanged, while a distance between the straight lines where portions of the first wiring 11 and the second wiring 12 in adjacent cross units are located decreases. Therefore, when the first wiring 11 and the second wiring 12 are crossing, the distance therebetween decreases periodically, while the magnitudes of the interference currents generated on the wirings are proportional to the distances from the interference point to the straight lines where the wirings are located, thus when the first wiring 11 and the second wiring 12 are crossing, a difference between the magnitude of the total interference current $I_1$ generated on the first wiring and the magnitude of the total interference current $I_2$ generated on the second wiring is small, namely, crossing of the first wiring and the second wiring 12 can reduce the interference current $I=I_1-I_2$ generated on the ground wire conduction loop; wherein $I_1=I_{11}+I_{12}+ \ldots +I_{1N}$, $I_2=I_{21}+I_{22}+ \ldots +I_{2N}$.

In the second manner of crossing as shown in FIG. 4, a distance d between the straight line where the first left wiring in the left cross unit is located and the straight line where the second right wiring in the right cross unit is located is zero.

If d=0, then supposing that the position of the interference source is fixed, a distance between the straight line where the first left wiring of the first wiring 11 is located and the straight line where the second left wiring of the second wiring 12 is located is large, i.e. an absolute value of $I_{11'}-I_{21'}$ is large. Besides, since the first wiring 11 and the second wiring 12 are crossing, a distance between the straight line where the first left wiring of the first wiring 11 is located and the straight line where the second right wiring of the second wiring 12 is located is 0, i.e. $I_{11'}-I_{22'}=0$. Likewise, although an absolute value of $I_{12'}-I_{22'}$ is large, $I_{21'}-I_{12'}=0$.

If the first wiring 11 and the second wiring 12 cross to form two cross units, then the interference current $I=I_1-I_2$ $(I_{11}+I_{12})-(I_{21}+I_{22})=(I_{11}-I_{22})+(I_{12}-I_{21})$ on the ground wire conduction loop is 0.

According to the above analyses, when the first wiring 11 and the second wiring 12 are crossing, a distance between the straight lines where portions of the first wiring 11 and the second wiring 12 in the same cross unit are located remain unchanged, while a distance between the straight lines where portions of the first wiring 11 and the second wiring 12 in adjacent cross units are located is 0. Therefore, suppose that the first wiring 11 and the second wiring 12 cross to form several pairs of cross units as shown in FIG. 4, $I_{11'}-I_{22'}=0$, $I_{21'}-I_{12'}=0$, then when the first wiring 11 and the second wiring 12 are crossing, a difference between the magnitude of the total interference current $I_1$ generated on the first wiring and the magnitude of the total interference current $I_2$ generated on the second wiring is 0, namely, crossing of the first wiring 11 and the second wiring 12 can reduce the interference current I generated on the ground wire conduction loop, where $I=I_1-I_2=0$; wherein $I_1=I_{11}+I_{12}+ \ldots +I_{1N}$, $I_2=I_{21}+I_{22}+ \ldots +I_{2N}$.

It can be seen from the above descriptions that in the substrate provided in the present embodiment, the first wiring 11 and the second wiring 12 have a plurality of cross points and are grounded; the first wiring 11 and the second wiring 12 are insulated from each other, so that although the first wiring 11 and the second wiring 12 form a plurality of cross points, short-circuit will not occur during crossing thereof. Moreover, the first wiring 11 and the second wiring 12 form the ground wire conduction loop together with the circuit board, and the interference current I on the ground wire conduction loop equals to a difference between the interference current $I_1$ generated on the first wiring and the interference current $I_2$ generated on the second wiring. In addition, since the first wiring 11 and the second wiring 12 have a plurality of cross points, the interference current $I_1$ on the first wiring 11 and the interference current $I_2$ on the second wiring 12 have close magnitudes if they have the same direction. Therefore, in the substrate provided in the present embodiment, the interference current I in the ground wire conduction loop can be reduced by the first wiring 11 and the second wiring 12 forming a plurality of cross points and being insulated from each other, thereby realizing anti-interference.

In addition, in the substrate provided in the present embodiment, the first wiring 11 and the second wiring 12 have a plurality of cross points and are insulated from each other to realize anti-interference, so it is unnecessary to interrupt the ground wire conduction loop. As a result, the anti-static ability of the touch screen will not be affected.

It shall be noted that the substrate in the above embodiment can be a touch substrate or a display substrate. When the substrate is a touch substrate, the functional area is a touch area and the peripheral area is a non-touch area. When the substrate is a display substrate, the functional area is a display area and the peripheral area is a non-display area.

Moreover, referring to FIG. 1, although the first wiring 11 and the second wiring 12 in the above embodiment have a plurality of cross points, they do not really cross at the cross points, but they merely cross spatially. Referring to FIG. 2, which is an enlarged top view of FIG. 1, the second wiring 12 is orthographic projected to the plane of the first wiring 11, and a cross point of the first wiring 11 and the orthographic projection of the second wiring 12 is O, which is just the cross point of the first wiring 11 and the second wiring 12 in the above embodiment.

In order to effectively reduce the interference current I in the ground wire conduction loop, a distance between two adjacent cross points can be set to be at least 1 cm, thereby to more effectively reduce the interference current I in the ground wire conduction loop.

Referring to FIG. 2, in view of the insulation between the first wiring 11 and the second wiring 12, and in order to prevent short-circuit and interference therebetween, not only an insulating layer 10 needs to be provided at each cross point to insulate the first wiring 11 from the second wiring 12, but also the portions of the first wiring 11 and the second wiring 12 between two adjacent cross points need to be separated, i.e. portions of the first wiring 11 and the second wiring 12 in the same cross unit are separated from each other. There are many ways to realize such separation, and an example is given below for illustration rather than limitation.

FIG. 2 shows that the included angle formed by the first wiring 11 and the second wiring 12 at each cross point is α, which is an obtuse angle, and the area corresponding to said included angle is in the cross unit. Thus the first wiring 11 and the second wiring 12 that cross once can have a distance large enough before the next crossing to reduce the probability of occurrence of short-circuit and interference therebetween.

Moreover, the larger the included angle α of the first wiring 11 and the second wiring 12 at each cross point, the lower the probability of occurrence of short-circuit and interference between the first wiring 11 and the second wiring 12. In certain exemplary embodiments, when α=120°-160°, crossing of the first wiring 11 and the second wiring 12 can well reduce the probability of occurrence of short-circuit and interference between the first wiring 11 and the second wiring 12; besides, in this range of angle, the distance between the first wiring 11 and the second wiring 12 is suitable, thus avoiding occupation of too much space because of the large distance therebetween.

It shall be noted that although the first left wiring, the first right wiring, the second left wiring and the second right wiring are idealized as straight lines when analyzing the interference current magnitude relation among the first left wiring, the first right wiring, the second left wiring and the second right wiring, the first left wiring, the first right wiring, the second left wiring and the second right wiring are not necessarily straight lines in practice, but they may have the following structures.

As shown in FIGS. 3 and 4, a portion of the first wiring 11 between two adjacent cross points and a portion of the second wiring 12 between two adjacent cross points form a cross unit, and a portion of the first wiring in the cross unit includes a first cross wiring section and a first parallel wiring section, and a portion of the second wiring in the cross unit includes a second cross wiring section and a second parallel wiring section.

When the first parallel wiring section and the second parallel wiring section are in the same cross unit, a wiring direction of the first parallel wiring section is parallel to a wiring direction of the second parallel wiring section.

When the first parallel wiring section and the second parallel wiring section are in two adjacent cross units, as shown in FIG. 3, a straight line where the wiring direction of the first parallel wiring section is located is spaced apart from a straight line where a wiring direction of the second parallel wiring section is located, and said space has a width d; or as shown in FIG. 4, the wiring direction of the first parallel wiring section and the wiring direction of the second parallel wiring section are in the same straight line.

Referring to FIGS. 1 and 2, when the first wiring 11 and the second wiring 12 in the above embodiment cross for several times, along the wiring direction of the first wiring 11, the first wiring 11 has a plurality of first cross points thereon, and two adjacent first cross points have an interval; along the wiring direction of the second wiring 12, the second wiring 12 has a plurality of second cross points thereon corresponding to the plurality of first cross points, and insulating layers 10 are provided between the first cross points and the corresponding second cross points. The insulating layers 10 herein can be insulating thin films or any other forms of insulating layers 10. In other words, the plurality of first cross points refer to cross points of the first wiring 11 and the orthographic projection of the second wiring 12 on the first wiring, the plurality of second cross points refer to points on the second wiring 12 corresponding to the cross points of the orthographic projection of the second wiring 12 and the first wiring 11.

An embodiment of the present disclosure further provides a touch screen, comprising the substrate in the above technical solution, wherein when the substrate is a touch substrate, the first wiring 11 and the second wiring 12 are provided at the periphery of a wiring 2 of the touch screen, and the first wiring 11, the second wiring 12 and the wiring 2 of the touch screen are provided on an ITO conductive film.

An embodiment of the present disclosure further provides a touch display device, comprising the touch screen mentioned above.

The touch display device in the above embodiment can be any product or component having a display function, such as a cell phone, a tablet PC, a TV, a monitor, a laptop, a digital photo frame or a navigator.

In the above descriptions of the embodiment, specific features, structures, materials or characteristics can be combined in any one or more embodiments or examples in appropriate manners.

The above embodiments are merely examples of the technical solution of the present disclosure, while they do not intend to limit the protection scope of the present disclosure. Any variation or substitution that is easily conceivable by those skilled in the art within the technical scope disclosed by the present disclosure shall fall into the protection scope of the present disclosure. Thus the protection scope of the present disclosure is defined by the appended claims.

The invention claimed is:

1. A touch screen, which comprises a substrate, the substrate comprising: a functional area and a peripheral area, wherein a first wiring and a second wiring insulating from each other are arranged in the peripheral area, said first wiring and second wiring are grounded respectively and are connected to a circuit board respectively to form a ground wire conduction loop; and said first wiring and said second wiring have a plurality of cross points, wherein a portion of the first wiring between two adjacent cross points and a portion of the second wiring between two adjacent cross points form a cross unit, and a portion of the first wiring in the cross unit includes a first cross wiring section and a first parallel wiring section, and a portion of the second wiring in the cross unit includes a second cross wiring section and a second parallel wiring section.

2. The touch screen according to claim 1, wherein two adjacent cross points have a distance of at least 1 cm therebetween.

3. The touch screen according to claim 1, wherein said substrate is a touch substrate; and wherein the functional area is a touch area, and the peripheral area is a non-touch area.

4. The touch screen according to claim 1, wherein said substrate is a display substrate; and wherein the functional area is a display area, and the peripheral area is a non-display area.

5. A touch display device, comprising: the touch screen of claim 1.

6. The touch screen according to claim 1, wherein said first wiring and said second wiring have a plurality of uniformly distributed cross points.

7. The touch screen according to claim 1, wherein the first wiring and second wiring between two adjacent cross points are separated from each other, and insulating layers for insulating the first wiring from the second wiring are provided at the cross points of the first wiring and the second wiring.

8. The touch screen according to claim 7, wherein the plurality of cross points on the first wiring are a plurality of first cross points that are arranged along a wiring direction of the first wiring, and two adjacent first cross points have an interval therebetween; and the plurality of cross points on the second wiring are a plurality of second cross points that are one to one corresponding to the plurality of first cross points and are arranged along a wiring direction of the second wiring, and insulating layers are provided between the first cross points and the corresponding second cross points.

9. The touch screen according to claim 1, wherein a portion of the first wiring between two adjacent cross points and a portion of the second wiring between two adjacent cross points form a cross unit, and a portion of the first wiring in the cross unit includes a first cross wiring section and a first parallel wiring section, and a portion of the second wiring in the cross unit includes a second cross wiring section and a second parallel wiring section.

10. The touch screen according to claim 9, wherein a wiring direction of the first parallel wiring section is parallel to a wiring direction of the second parallel wiring section in the same cross unit.

11. The touch screen according to claim 9, wherein a wiring direction of the first parallel wiring section and a wiring direction of the second parallel wiring section in an adjacent cross unit are on the same straight line.

12. The touch screen according to claim 1, wherein an included angle formed by the first wiring and the second wiring at each cross point is an obtuse angle, and an area corresponding to said included angle is in the cross unit.

\* \* \* \* \*